United States Patent
Seki et al.

(10) Patent No.: US 9,903,047 B2
(45) Date of Patent: Feb. 27, 2018

(54) PRODUCTION METHOD OF SIC CRYSTAL

(71) Applicants: TOYOTA JIDOSHA KABUSHIKI KAISHA, Toyota-shi, Aichi-ken (JP); JAPAN FINE CERAMICS CENTER, Nagoya-shi, Aichi-ken (JP)

(72) Inventors: Akinori Seki, Shizuoka-ken (JP); Yukari Ishikawa, Nagoya (JP)

(73) Assignees: TOYOTA JIDOSHA KABUSHIKI KAISHA, Toyota (JP); JAPAN FINE CERAMICS CENTER, Nagoya-shi (JP)

( * ) Notice: Subject to any disclaimer, the term of this patent is extended or adjusted under 35 U.S.C. 154(b) by 43 days.

(21) Appl. No.: 15/185,690

(22) Filed: Jun. 17, 2016

(65) Prior Publication Data

US 2016/0369424 A1 Dec. 22, 2016

(30) Foreign Application Priority Data

Jun. 22, 2015 (JP) .................................. 2015-125019

(51) Int. Cl.

| | |
|---|---|
| C30B 25/18 | (2006.01) |
| C30B 23/02 | (2006.01) |
| C30B 29/36 | (2006.01) |
| C23C 14/18 | (2006.01) |
| C23C 14/34 | (2006.01) |
| C23C 14/48 | (2006.01) |
| C23C 16/32 | (2006.01) |

(52) U.S. Cl.
CPC ............ *C30B 25/186* (2013.01); *C23C 14/18* (2013.01); *C23C 14/185* (2013.01); *C23C 14/34* (2013.01); *C23C 14/48* (2013.01); *C23C 16/325* (2013.01); *C30B 23/025* (2013.01); *C30B 29/36* (2013.01)

(58) Field of Classification Search
CPC ......... C30B 23/02; C30B 25/02; C30B 25/18; C30B 29/36
See application file for complete search history.

(56) References Cited

U.S. PATENT DOCUMENTS

| | | |
|---|---|---|
| 2002/0104478 A1 | 8/2002 | Oguri et al. |
| 2012/0308758 A1 | 12/2012 | Hori et al. |

FOREIGN PATENT DOCUMENTS

| | | |
|---|---|---|
| JP | 2002234800 A | 8/2002 |
| JP | 2011-225392 A | 11/2011 |
| JP | 2012250864 A | 12/2012 |
| JP | 2013-211500 A | 10/2013 |
| WO | 2009/026269 A1 | 2/2009 |

*Primary Examiner* — Robert M Kunemund
(74) *Attorney, Agent, or Firm* — Oliff PLC

(57) ABSTRACT

A method for producing an SiC crystal, comprising supplying a raw material gas containing Si, C and N to vapor-grow an N-doped SiC crystal on an SiC substrate, wherein the SiC substrate is an SiC substrate on which La, Ce or Ti is deposited in part or whole of the surface or an SiC substrate in which La, Ce or Ti ion is implanted into part or whole of the surface.

6 Claims, 12 Drawing Sheets

PRODUCTION METHOD OF SIC CRYSTAL

TECHNICAL FIELD

The present invention relates to a method for producing an SiC crystal on an SiC substrate. More specifically, the present invention relates to a production method of an N-doped SiC crystal.

BACKGROUND ART

For forming an SiC crystal on an SiC substrate, a CVD method is generally applied. In the CVD method, an SiC substrate and a susceptor supporting the SiC substrate are heated while supplying a raw material gas into a reaction chamber, and a chemical reaction is thereby caused in vapor phase to allow for vapor-phase growth of an SiC crystal.

The method for doping a specific element into an SiC crystal is roughly classified into two methods. A first method is a method where a specific element working out to a dopant element is further added as the element contained in a raw material gas for use in the CVD method, in addition to Si and C, and an SiC crystal doped with the specific element is vapor-phase grown. A second method is a method where an SiC crystal not doped with a specific element is first vapor-phase grown by the CVD method without adding a specific element as a dopant element to a raw material gas for use in the CVD method and then a specific element is doped into the SiC crystal by using an ion implantation method.

As to the method for vapor-phase growing an SiC crystal doped with a specific element by using the CVD method, for example, Patent Document 1 discloses a method where an N-doped SiC crystal is vapor-phase grown on an SiC substrate by using a raw material gas containing N as a dopant element in addition to Si and C. As the raw material gas, a mixed gas of Si-based gas, C-based gas, and $N_2$ gas is disclosed. Furthermore, a monosilane gas and a dichlorosilane gas as the Si-based gas, and a propane gas and a methane gas as the C-based gas are disclosed.

In the method disclosed in Patent Document 1, an SiC crystal doped with a relatively low concentration of N is vapor-phase grown. Specifically, the N donor concentration is $2.0 \times 10^{15}$ atom/cm$^3$ or more and less than $5.0 \times 10^{16}$ atom/cm$^3$.

RELATED ART

Patent Document

[Patent Document 1] Japanese Unexamined Patent Publication No. 2013-211500

SUMMARY OF THE INVENTION

Problems to be Solved by the Invention

In the method disclosed in Patent Document 1, N is hardly doped into an SiC crystal. Therefore, in order to increase the N donor concentration to a range of $1 \times 10^{17}$ to $9 \times 10^{17}$ atom/cm$^3$, the amount of $N_2$ gas in the raw material gas must be set to about 20 times the total amount of Si-based gas and C-based gas.

In addition, in the method disclosed in Patent Document 1, it is difficult to increase the N donor concentration only in a partial region of the SiC crystal.

On the other hand, in the case of increasing the N donor concentration only in a partial region of the SiC crystal, doping of N by an ion implantation method is performed. That is, ion implantation of N only in a partial region is performed.

However, ion implantation is a method of implanting a high-energy ion into a crystal from outside the crystal and therefore, is likely to damage the structure of an SiC crystal. That is, a stacking fault, an extension of basal plane dislocation, a BPD half loop, and a point defect are readily generated. As a result, the performance of a device fabricated tends to be deteriorated. In order to prevent the performance deterioration, a heat treatment for recovering the crystal structure is generally performed. However, the heat treatment causes quality deterioration of an SiC crystal and increases the number of steps.

An object of the present invention is to provide a production method of an SiC crystal, where N can be efficiently doped.

Another object of the present invention is to provide a production method of an SiC crystal, where the N donor concentration can be increased only in a partial region of an SiC crystal without damaging the structure of the SiC crystal.

Means to Solve the Problems

As a result of intensive studies, the present inventors have reached the idea of the present invention. The gist of the present invention is as follows.

<1> A method for producing an SiC crystal, including supplying a raw material gas containing Si, C and N to vapor-grow an N-doped SiC crystal on an SiC substrate to produce an SiC crystal, wherein the SiC substrate is an SiC substrate having deposited on the surface thereof La, Ce or Ti or an SiC substrate having implanted thereinto La, Ce or Ti ion.

<2> The method according to <1>, wherein only in part of the surface of the SiC substrate, La, Ce or Ti is deposited or La, Ce or Ti ion is implanted.

<3> The method according to <1> or <2>, wherein the La, Ce or Ti is deposited by a vapor deposition method, a sputtering method, or a CVD method.

<4> The method according to any one of <1> to <3>, further including removing the deposited La, Ce or Ti after the vapor-phase growth.

<5> The method according to <1> or <2>, further comprising applying an annealing treatment to the SiC substrate having implanted thereinto La, Ce or Ti ion, after the ion implantation and before the supply of the raw material gas.

<6> The method according to any one of <1> to <5>, further comprising depositing La, Ce or Ti on or ion-implanting La, Ce or Ti into the surface of the SiC crystal in the middle of the vapor-phase growth.

Effects of the Invention

According to the present invention, a production method of an SiC crystal, where N can be effectively doped, can be provided.

Furthermore, according to the present invention, a production method of an SiC crystal, where the N donor concentration can be increased only in a partial region of an SiC crystal without damaging the structure of the SiC crystal, can be provided.

MODE FOR CARRYING OUT THE INVENTION

Figure 1:
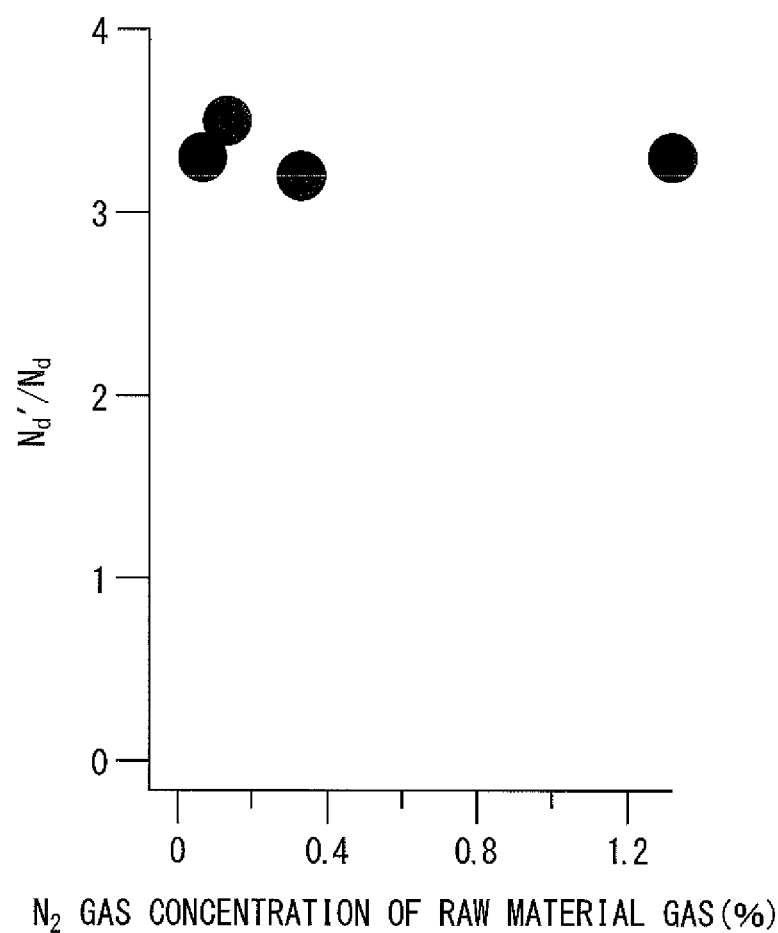
FIG. 1 A graph illustrating the relationship between the $N_2$ concentration of the raw material gas and $N_d'/N_d$ (the rate of improvement in the N donor concentration due to deposition of a given amount of La).

Embodiments of the production method of an SiC crystal according to the present invention are described in detail below. Here, the following embodiments are not intended to limit the present invention.

In the production method of an SiC crystal according to the present invention, an N-doped SiC crystal is vapor-grown on an SiC substrate by supplying a raw material gas containing Si, C and N. At this time, a normal CVD apparatus may be used.

The raw material gas containing Si, C and N may be the same as that in a normal CVD method. For example, a mixed gas of a gas containing Si, a gas containing C and a gas containing N may be used. The gas containing Si includes, for example, $SiCH_3H_3$ (monomethylsilane) gas, $SiH_4$ (monosilane) gas, and $SiH_2Cl_2$ (dichlorosilane), and these may be used in combination. The gas containing C includes $CH_4$ (methane) gas, $C_2H_6$ (ethane) gas, $C_3H_8$ (propane) gas, etc., and these may be used in combination. The gas containing N includes $N_2$ gas and $NH_3$ gas, and these may be used in combination.

The raw material gas containing Si, C and N may be supplied together with a carrier gas to the reaction chamber of a CVD apparatus. The carrier gas includes $H_2$ gas, Ar gas, etc., and these may be used in combination. In the case of using a carrier gas, the concentration (vol %) of each gas is measured relative to the total of the raw material gas containing Si, C and N and the carrier gas. For example, in the case of using, as the raw material gas, a mixed gas of $SiCH_3H_3$ gas, $CH_4$ gas and $N_2$ gas and using a carrier gas, the $N_2$ gas concentration (vol %) is [(volume of $N_2$ gas)/{(volume of $SiCH_3H_3$ gas)+(volume of $CH_4$ gas)+(volume of $N_2$ gas)+(volume of carrier gas)}]×100.

In the case of using a normal SiC substrate, i.e., an SiC substrate having not deposited thereon La, an N-doped SiC crystal is continuously vapor-grown from the surface of the SiC substrate. However, the N doping efficiency is low due to chemical reactivity among Si, C and N.

In the present invention, an SiC substrate having deposited on the surface thereof La, Ce or Ti or an SiC substrate having implanted thereinto La, Ce or Ti ion is used. In the following, the description is mainly focused on La, but the same applies to Ce or Ti. The reason therefor is described later.

(In Case of Using an SiC Substrate Having Deposited on the Surface Thereof La)

First, a case of using an SiC substrate having deposited on the surface thereof La is described. The method for obtaining an SiC substrate having deposited thereon La is not particularly limited. For example, a method of depositing La on the surface of an SiC substrate by a vapor deposition method, a sputtering method, or a CVD method is included.

In any method by which La is deposited, the surface of the La layer after the deposition may be cleaned by heat treatment in an $H_2$ atmosphere. The temperature and time may be appropriately determined, but the temperature is preferably from 1,550 to 1,750° C., and the time is preferably from 10 to 60 minutes. When the temperature is 1,550° C. or more, the $H_2$ gas is activated, and the cleaning effect is enhanced. The temperature is more preferably 1,575° C. or more, 1,600° C. or more, or 1,625° C. or more. On the other hand, when the temperature is 1,750° C. or less, the reduction in the growth rate due to an increase in the etching effect of SiC does not arise as a problem. The temperature is more preferably 1,725° C. or less, 1,700° C. or less, or 1,675° C. or less.

When a raw material gas containing Si, C and N is supplied onto an SiC substrate having deposited on the surface thereof La, the gas passes through individual La deposited on the SiC substrate surface, and an N-doped SiC crystal is vapor-grown to enter between the SiC substrate and La. At this time, La is present on the surface of the SiC crystal doped with N. In this way, an N-doped SiC crystal is continuously vapor-grown.

According to WebElements Periodic Table (http://www-.webelements.com/), the covalent radius of Si is 116 pm, and the covalent radius of C is 75 pm, whereas the covalent radius of La is 180 pm. That is, the covalent radius of La is larger than the covalent radius of each of Si and C. Accordingly, La is more stable when La exists outside the crystal lattice of Si and C than when La, substitutional atom or interstitial atom, exists in the crystal lattice of Si and C. This allows an N-doped SiC crystal to be continuously vapor-grown between the SiC substrate and La.

In addition, since the chemical reactivity among Si, C and N is enhanced by La, the N doping efficiency is high.

Here, $N_d'/N_d$ is taken into consideration, assuming that the N donor concentration in the case of using an SiC substrate having not deposited on the surface thereof La is $N_d$ and the N donor concentration in the case of using an SiC substrate having deposited on the surface thereof La is $N_d'$. Incidentally, the carrier concentration of an SiC crystal that is vapor-grown without doping N is at the level of $10^{14}$ atom/cm$^3$ and therefore, when the concentration is controlled in the range of $10^{15}$ to $10^{18}$ atom/cm$^3$, the N donor concentration is equal to the n-type carrier concentration.

An increase in the N concentration in the raw material gas containing Si, C and N leads to an increase in the N donor concentration. Therefore, when $N_d'/N_d$ is taken into consideration, the net effect of improving the N donor concentration due to use of an SiC substrate having deposited on the surface thereof La can be evaluated without an influence of the increase in the N concentration in the raw material gas containing Si, C and N. That is, $N_d'/N_d$ means the rate of improvement in the N donor concentration by La deposition.

FIG. 1 is a graph illustrating one example of the relationship between the $N_2$ concentration (in FIG. 1, for the sake of saving space, simply referred to as "$N_2$ concentration of raw material gas") of the raw material gas containing Si, C and N and $N_d'/N_d$ under the condition that La is deposited in a given amount (to a given thickness of 0.5 nm).

As seen from FIG. 1, irrespective of the $N_2$ concentration of the raw material gas containing Si, C and N, the value of $N_d'/N_d$ is substantially constant. Then it can be said that by using an SiC substrate having deposited on the surface thereof La, the N doping efficiency is enhanced. This means that the chemical reactivity among Si, C and N is enhanced by La deposition.

Figure 2:
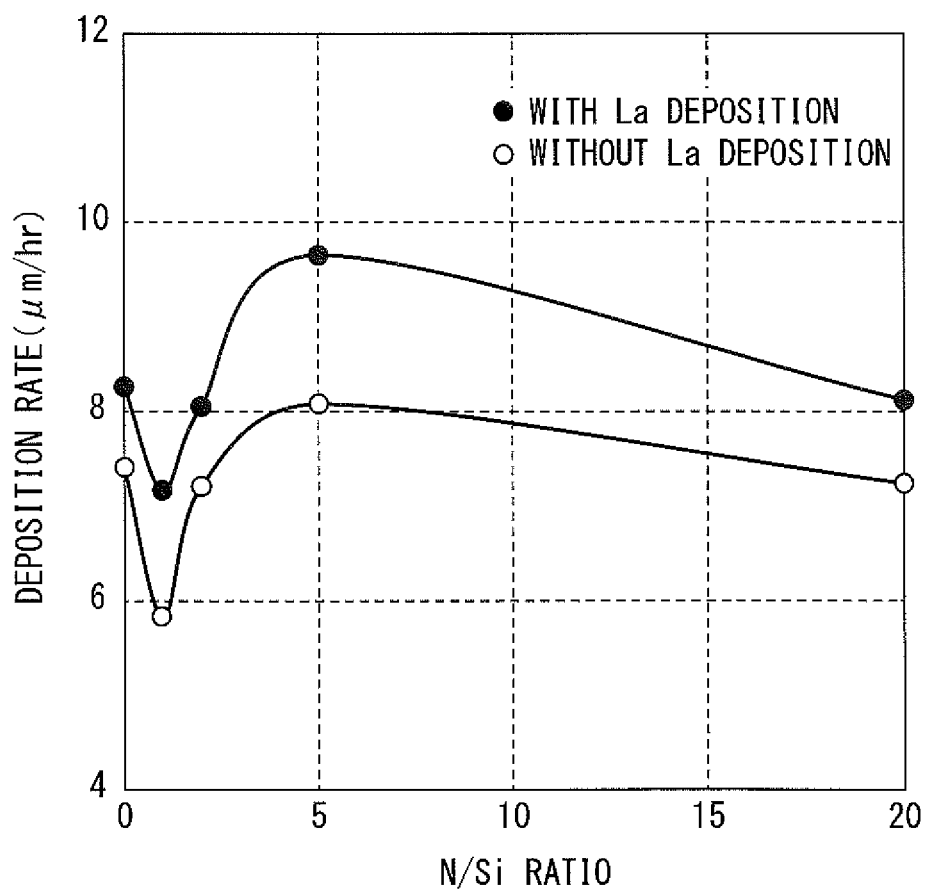
FIG. 2 A graph comparing the relationship between the N/Si ratio of the raw material gas and the film deposition rate of an N-doped SiC crystal, by the presence or absence of La deposition.

The enhancement of chemical reactivity is explained from the standpoint of the film deposition rate of the N-doped SiC crystal. FIG. 2 is a graph illustrating one example of the relationship between the concentration ratio of the raw material gas containing Si to the raw material gas containing N, i.e., N/Si ratio, and the film deposition rate of an N-doped SiC crystal, by comparing a case of using an SiC substrate having deposited on the surface thereof La with a case of using an SiC substrate having not deposited on the surface thereof La.

In FIG. 2, for the sake of saving space, the N/Si ratio of the raw material gas containing Si, C and N is simply shown as "N/Si ratio"; the film deposition rate of the N-doped SiC crystal is simply shown as "film deposition rate"; the "case of using an SiC substrate having deposited on the surface thereof La" is shown as "with La deposition"; and the "case of using an SiC substrate having not deposited on the surface thereof La" is shown as "without La deposition".

As seen from FIG. 2, when an SiC substrate having deposited on the surface thereof La is used, the film deposition rate of the SiC crystal is enhanced. From this, it can be said that the chemical reactivity among Si, C and N is enhanced by La deposition.

As described in the forgoing pages, when an SiC substrate having deposited on the surface thereof La is used, an action/effect of enhancing the N doping efficiency and the film deposition rate in the N-doped SiC crystal are obtained. Next, the correlation of this action/effect with the La deposition amount is explained.

As for the La deposition amount, La is preferably deposited in an amount of $1\times10^{12}$ atom/cm$^2$ or more per unit area. When the amount is $1\times10^{12}$ atom/cm$^2$ or more, the distance between individual La is not excessively large, so that the above-described action/effect can be uniformly obtained in the region where La is deposited. The amount is more preferably $5\times10^{12}$ atom/cm$^2$ or more, or $1\times10^{13}$ atom/cm$^2$ or more.

On the other hand, La is preferably deposited in an amount of $1\times10^{16}$ atom/cm$^2$ or less per unit area. When the amount is $1\times10^{16}$ atom/cm$^2$ or less, the above-described action/effect is not saturated. The amount is more preferably $5\times10^{15}$ atom/cm$^2$ or less, or $1\times10^{15}$ atom/cm$^2$ or less.

Here, the deposition amount of $1\times10^{12}$ to $1\times10^{16}$ atom/cm$^2$ is, in terms of La deposition thickness, from $3\times10^{-4}$ to 3.7 nm. The deposition amount of $1\times10^{12}$ atom/cm$^2$ corresponds to one La atom deposition per 1,000 atoms of the total of Si atom and C atom exposed to the surface. In addition, the deposited La when expressed by the measured value in performing X-Ray Photoelectron Spectroscopy analysis (XPS) corresponds to 0.01 to 100 atom %.

For reference, with respect to the N concentration of the raw material gas containing Si, C and N, description is added by taking $N_2$ gas as an example. As illustrated in FIG. 1, irrespective of the $N_2$ gas concentration of the raw material gas containing Si, C and N, the value of $N_d'/N_d$ is substantially constant. This reveals that irrespective of the $N_2$ gas concentration of the raw material, the N doping efficiency is substantially constant. In the present invention, a higher N donor concentration than ever before is obtained with a small supply of $N_2$ gas and therefore, an excessive supply of $N_2$ gas is not necessary.

(In Case of Using an SiC Substrate Having Implanted Thereinto La Ion)

A case of using an SiC substrate having implanted thereinto La ion is explained below. The range of La is small relative to the accelerating voltage, because of its large atomic weight. Accordingly, even when the accelerating voltage is 170 keV, the range stays at about 55 nm.

When the La ion-implantation depth is 100 nm or less from the SiC substrate surface, there is obtained the same action/effect as that La is deposited near the SiC substrate surface, i.e., La is present on the SiC substrate surface. In order to allow for vapor-growth of an N-doped SiC crystal, the SiC substrate having implanted thereinto La ion is heated. As long as the La ion-implantation depth is 100 nm or less from the SiC substrate surface, at least part of the implanted La ion is considered to be annealed by the heating and segregated to the SiC substrate surface.

As described above, the atomic weight of La is large and therefore, the range stays at about 55 nm even when the accelerating voltage is 170 keV. Therefore, La ion can be hardly implanted into a deep position from the SiC substrate surface and at the same time, since the covalent radius of La is larger than the covalent radius of each of Si and C, La is likely to be segregated to the SiC substrate surface by annealing treatment.

The conditions for annealing treatment may be appropriately determined, but the temperature is preferably from 1,550 to 1,750° C., and the time is preferably from 10 to 60 minutes. When the temperature is 1,550° C. or more, many La can be relatively easily, segregated to the SiC substrate surface. On the other hand, when the temperature is 1,750° C. or less, reduction in the surface La concentration due to evaporation can be suppressed.

Incidentally, the same effect as annealing can be obtained by the temperature rise at the time of vapor-growth of an SiC crystal and therefore, annealing may not be separately applied. On the other hand, the vapor pressure of La is relatively low and therefore, even when annealing is performed over 3 hours in an $H_2$ gas flow atmosphere at a low pressure (1.33 kPa (10 torr)) where evaporation readily proceeds, La is kept from being entirely evaporated.

As described above, the La ion-implantation depth may be 100 nm or less from the SiC substrate surface. In this viewpoint, the accelerating voltage at the time of ion implantation is preferably from 15 to 170 keV. When the voltage is 15 keV or more, La ion can be efficiently implanted into the SiC substrate. On the other hand, when the voltage is 170 keV or less, the range of ion does not exceed 100 nm.

The apparatus used for ion-implanting La into the SiC substrate is not particularly limited. For example, a high-current ion implantation apparatus, a medium-current ion implantation apparatus, or a high-energy ion implantation apparatus may be used.

(Deposition or Ion-Implantation of La in the Middle of Vapor-Growth)

In the middle of vapor-growth of an N-doped SiC crystal, La may be further deposited on or ion-implanted into the SiC crystal surface. By doing so, the N donor concentration of an SiC crystal that is vapor-grown after further depositing or ion-implanting La, and the N donor concentration of an SiC crystal that is vapor-phase grown before further depositing or ion-implanting La, can be made to be different concentrations.

Needless to say, La deposited or ion-implanted in the middle of vapor-growth of an N-doped SiC crystal is also present on the surface of an SiC crystal that is vapor-grown after the deposition or ion-implantation.

In the case of further depositing La in the middle of vapor-growth of an N-doped SiC crystal, La may be deposited by stopping the supply of the raw material gas containing Si, C and N, or La may be deposited while vapor-growing an N-doped SiC crystal. As the method for depositing La while vapor-growing an N-doped SiC crystal, the vapor-growth is continued by changing the gas to a raw material gas containing Si, C, N and La in the mille of supplying the raw material gas containing Si, C and N.

(Removal of Deposited La)

After vapor-growing an N-doped SiC crystal, the deposited La remains on the SiC substrate surface. This deposited La is removed at the time of attaching an electrode, etc. to the SiC crystal to fabricate a device, whereby the original characteristics of the N-doped SiC crystal can be fully exerted.

The method for removal is not particularly limited, but a method causing no change in the quality of the N-doped SiC crystal is preferred. The method is, for example, CMP polishing, lapping, or etching. A method where the flatness of the N-doped SiC crystal after removal is easily ensured, is more preferred. The method is, for example, CMP polishing or lapping.

(SiC Substrate where La is Deposited Only in Part of Surface)

When La is deposited only in part of the SiC substrate surface, with respect to an N-doped SiC crystal, the N donor concentration in the La deposition region can be made higher than the N donor concentration in other portions.

Figure 3:
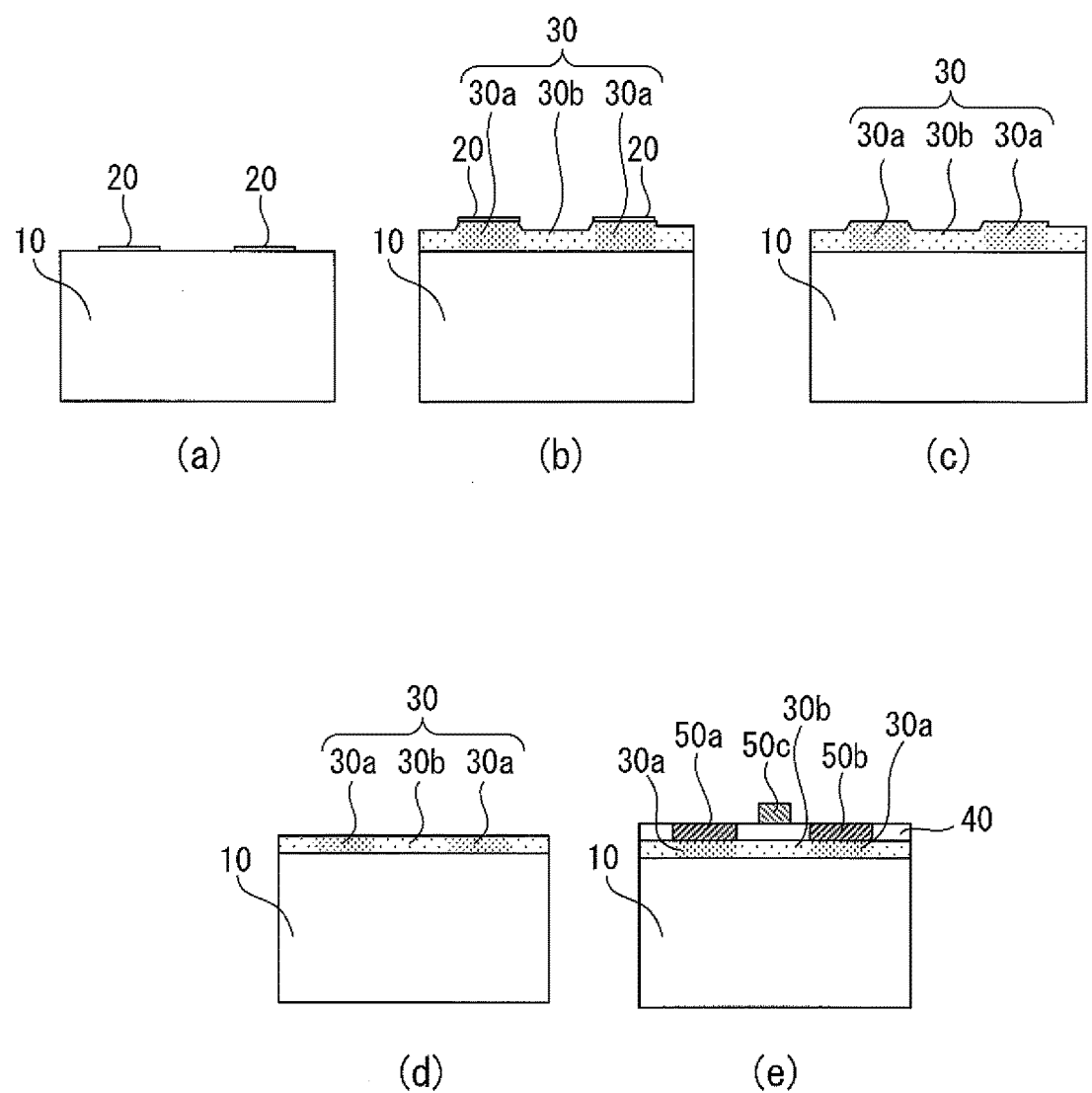
FIG. 3 A view illustrating one example of the embodiment where La is deposited only in part of the surface of the SiC substrate, out of embodiments of the present invention.

FIG. 3 is a view illustrating one example of the embodiment where an N-doped SiC crystal is vapor-grown on an SiC substrate having deposited La only in part of the surface, out of embodiments of the present invention.

FIG. 3(a) is a schematic view illustrating the cross-section of an SiC substrate where La is deposited only in part of the surface. FIG. 3(b) is a schematic view illustrating the cross-section after an N-doped SiC crystal is vapor-grown on the SiC substrate of FIG. 3(a). FIG. 3(c) is a schematic view illustrating the cross-section after removing La present on the surface of the N-doped SiC crystal. FIG. 3(d) is a schematic view illustrating the cross-section after flattening the surface of the N-doped SiC crystal. FIG. 3(e) is a schematic view illustrating the cross-section after an insulating film and respective electrodes are attached to the SiC substrate of FIG. 3(d) to fabricate a horizontal MESFET transistor.

As illustrated in FIG. 3(a), an La deposition region 20 is formed only in part of the surface of an SiC substrate 10. The deposition method may be any of the methods described above.

The SiC substrate illustrated in FIG. 3(a) is set in a reaction chamber (not shown), and a raw material gas containing Si, C and N is supplied to the reaction chamber, whereby, as illustrated in FIG. 3(b), an N-doped SiC crystal 30 is vapor-grown in both the La deposition region 20 and the portion other than the La deposition region 20. The La deposition region 20 is present on the surface opposite the SiC substrate 10 of the N-doped SiC crystal 30. That is, the N-doped SiC crystal 30 is vapor-grown in a portion sandwiched by the SiC substrate 10 and the La deposition region 20.

As a result, in the N-doped SiC crystal 30, the portion sandwiched by the SiC substrate 10 and the La deposition region 20 is deposited as a high nitrogen concentration part 30a. On the other hand, the portion other than the portion sandwiched by the SiC substrate 10 and the La deposition layer 20 is deposited as a low nitrogen concentration part 30b.

In addition, by the action of the La deposition region 20, the film deposition rate of the high nitrogen concentration part 30a is higher than the film deposition rate of the low nitrogen concentration part 30b. As a result, the high nitrogen concentration part 30a is deposited to a larger thickness than the low nitrogen concentration part 30b.

As illustrated in FIG. 3(c), the La deposition region 20 may be removed after vapor-growth of the N-doped SiC crystal 30. The reason and method for removal are the same as those described above.

Since the high nitrogen concentration part 30a is deposited to a larger thickness than the low nitrogen concentration 30b, as illustrated in FIG. 3(d), the low nitrogen concentration part 30b and the high nitrogen concentration part 30a may be flattened by polishing, etc., according to the device design.

In manufacturing a device, in order to obtain desired properties, for example, an insulating film and respective electrodes may be attached, as illustrated in FIG. 3(e). For example, first, an insulating film 40 is formed on the flattened surface of the N-doped SiC crystal 30. The method for forming the insulating film 40 may be a conventional method. In addition, the material of the insulating film 40 is not limited as long as it can be assured of an insulating property, and the material is, for example, $SiO_2$.

Thereafter, out of the insulating film 40, a portion covering the high nitrogen concentration part 30a is removed to expose the SiC crystal 30. The removal method may be a conventional method and is, for example, wet etching or dry etching.

Furthermore, a source electrode 50a and a drain electrode 50b are formed in the exposed part of the SiC crystal 30. The method for formation is not limited but includes, for example, an electron beam deposition method. The formed source electrode 50a and drain electrode 50b may be heated at about 1,000° C. for about 10 minutes in an argon atmosphere so as to function as ohmic electrodes.

Subsequently, a gate electrode 50c is formed in part of a portion covering the low nitrogen concentration part 30b out of the insulating film 40. The method for formation is not particularly limited, but Ti, Pt or Au is formed by electron beam deposition.

The thus-manufactured horizontal MESFET transistor 60 of FIG. 3(e) is one example of the device, and different kinds of devices can be manufactured by appropriately changing the number and positional relationship of high nitrogen concentration parts 30a and low nitrogen concentration parts 30b. The device is, for example, an MOSFET transistor, a vertical or horizontal device, or a diode.

In such a device, when the high nitrogen concentration part 30a is deposited by defining, as the La deposition region 20, only the portion intended to achieve ohmic properties, a device greatly reduced in the contact resistance is obtained.
(SiC Substrate where La Ion is Implanted Only into Part of Surface)

An ion-implantation part (not shown) can be formed by ion-implanting La into a portion corresponding to the La deposition region 20 in FIG. 3.

By the annealing or the heating at the time of CVD, La in the ion-implantation part (not shown) is segregated to the SiC substrate 10 surface to form an La segregated region (not shown). The cross-section when the La segregated region (not shown) is formed is the same as the state where the La deposition region 20 is deposited only in part of the SiC substrate 10 surface (see, FIG. 3(a)).

The subsequent process is the same as in the case of using an SiC substrate where La is deposited only in part of the surface.
(SiC Substrate Having Deposited on the Surface Thereof Ce or Ti or SiC Substrate Having Implanted Thereinto Ce or Ti Ion)

In the foregoing pages, a case of using an SiC substrate having deposited on the surface thereof La or an SiC substrate having implanted thereinto La ion is described. According to WebElements Periodic Table (http://www.webelements.com/), the covalent radii of Si, C, La, Ce and Ti are 116 pm, 75 pm, 180 pm, 163 pm, and 136 pm, respectively. Therefore, although the covalent radii of Ce and Ti are smaller than the covalent radius of La, the covalent radius of each of Ce and Ti is larger than the covalent radii of Si and C.

In addition, Ce and Ti have a vapor pressure equal to that of La, so that the CVD conditions for vapor-growing an SiC crystal, particularly, the temperature, can be the same as in the case of La. That is, CVD can be performed at a temperature causing no melting or evaporation of La, Ce and Ti.

Therefore, Ce or Ti has, as with La, an action/effect of accelerating an increase in the N donor concentration and the film deposition rate with respect to an N-doped SiC crystal. For this reason, the SiC substrate having deposited on the surface thereof La or the SiC substrate having implanted thereinto La ion may be an SiC substrate having deposited on the surface thereof Ce or Ti or an SiC substrate having implanted thereinto La, Ce or Ti ion.

In the foregoing pages, an embodiment of using a normal CVD method is described as the method for vapor-growing an SiC crystal, but other methods for vapor-growth may also be used. For example, since La, Ce and Ti have a low vapor pressure, an SiC crystal can be vapor-grown using an SiC substrate having deposited on the surface thereof La, Ce or Ti or an SiC substrate having implanted thereinto La, Ce or Ti ion by a high-temperature CVD method where the ambient pressure is approximately an atmospheric pressure and the atmospheric gas temperature is about 2,000° C. In addition, since La, Ce and Ti have a low vapor pressure, an SiC crystal can be vapor-grown by a sublimation method, similarly to the above, by using an SiC seed having deposited on the surface thereof La, Ce or Ti or an SiC seed having implanted thereinto La, Ce or Ti ion. That is, the present invention is applicable to a high-temperature CVD method and a sublimation method, in addition to a general CVD method. The SiC crystal may be an epitaxially grown crystal or a non-epitaxially grown crystal. Furthermore, the vapor-grown SiC crystal is not limited to a thin film and may be of thick-layer form or may be a crystalline body such as bulk.

Example 1

The present invention is described more specifically below by referring to Examples. The present invention is not limited to the conditions used in the following Examples.

Preparation of Sample of Example 1a

La was deposited throughout the surface of an SiC substrate by a vapor deposition method. The deposition thickness was 0.5 nm. The La deposition amount was $1.3 \times 10^{15}$ atom/cm$^2$ in terms of the number of atoms per unit area. The SiC substrate having deposited thereon La was treated for 30 minutes in a hydrogen atmosphere at 1.33 kPa (10 Torr) and 1,650° C., whereby the surface of La was cleaned.

Subsequently, the SiC substrate having deposited thereon La was set in a reaction chamber, and a raw material gas containing Si, C and N (hereinafter, simply referred to as "raw material gas") was supplied to the reaction chamber together with $H_2$ gas as a carrier gas to prepare an N-doped SiC crystal (hereinafter, simply referred to as "SiC crystal") of Example 1a. As the raw material gas, a gas obtained by mixing $SiCH_3H_3$ gas, $CH_4$ gas and $N_2$ gas was supplied. The concentrations of $SiCH_3H_3$ gas, $CH_4$ gas and $N_2$ gas were 0.055%, 0.028% and 0.33%, respectively. Each gas concentration was in vol % relative to the total of $SiCH_3H_3$ gas, $CH_4$ gas, $N_2$ gas and $H_2$ gas.

Preparation of Sample of Comparative Example 1a

An SiC crystal of Comparative Example 1a was prepared under the same conditions as in Example 1a except for using an SiC substrate on which La is not deposited.
(Evaluation Method of Sample)

The SiC crystals of Example 1a and Comparative Example 1a were analyzed by Secondary Ion Mass Spectrometry (SIMS).
(Evaluation Results)

As regards the N donor concentration, the concentration was distributed in the range of $1.4 \times 10^{17}$ to $3.4 \times 10^{17}$ atom/cm$^3$ in the SiC crystal of Example 1a. On the other hand, in the SiC crystal of Comparative Example 1a, the concentration was $0.5 \times 10^{17}$ atom/cm$^3$ or less at any site.

In the SiC crystal of Example 1a, the La concentration was $1 \times 10^{19}$ atom/cm$^3$ near the surface of the SiC substrate and was not more than the measurement limit of secondary ion mass spectrometry (not more than $5 \times 10^{13}$ atom/cm$^3$) inside the SiC crystal. On the other hand, in the SiC crystal of Comparative Example 1a, the La concentration was not more than the measurement limit of secondary ion mass spectrometry at both the surface of the SiC substrate and the inside of the SiC crystal.

From these results, it was confirmed that the N donor concentration can be increased by La deposition. It was also confirmed that when La is deposited on the SiC substrate surface, an SiC crystal can be vapor-grown between the SiC substrate and La.

Example 2

Preparation of Samples of Examples 2a to 2d

La was deposited throughout the surface of an SiC substrate by a vapor deposition method. The deposition thickness was 0.5 nm. The La deposition amount was $1.3 \times 10^{15}$ atom/cm² in terms of the number of atoms per unit area. The SiC substrate having deposited thereon La was treated for 30 minutes in a hydrogen atmosphere at 1.33 kPa (10 Torr) and 1,650° C., whereby the surface of La was cleaned.

Subsequently, the SiC substrate having deposited thereon La was set in a reaction chamber, and a raw material gas was supplied to the reaction chamber together with $H_2$ gas as a carrier gas to prepare SiC crystals of Examples 2a, 2b, 2c and 2d. As the raw material gas, a gas obtained by mixing $SiCH_3H_3$ gas, $CH_4$ gas and $N_2$ gas was supplied. The concentration of $SiCH_3H_3$ gas was 0.055% in all of Examples 2a to 2d. The concentration of $CH_4$ gas was 0.028% in all of Examples 2a to 2d. The concentration of $N_2$ gas was 0.066% in Example 2a, 0.13% in Example 2b, 0.33% in Example 2c, or 1.3% in Example 2d. Each gas concentration was in vol % relative to the total of $SiCH_3H_3$ gas, $CH_4$ gas, $N_2$ gas and $H_2$ gas.

Preparation of Samples of Comparative Examples 2a to 2d

An SiC crystal of Comparative Example 2a was prepared under the same conditions as in Example 2a except for using an SiC substrate on which La is not deposited. Similarly, SiC crystals of Comparative Examples 2b, 2c and 2d corresponding to Examples 2b, 2c and 2d, respectively, were prepared.

(Evaluation Method of Sample)

The SiC crystals of Examples 2a to 2d and Comparative Examples 2a to 2d were measured for the N donor concentration by the C-V (capacity-voltage characteristic) method.

In addition, with respect to Examples 2a to 2d, the La concentration on the sample surface was measured after the vapor-phase growth of SiC crystal. In the measurement, X-ray photoelectron spectrometer Model 1600 manufactured by ULVAC-PHI, Inc. was used. At the measurement, the normal direction of the sample surface and the normal direction of the detector were arranged to make 45°.

(Evaluation Results)

Figure 4:
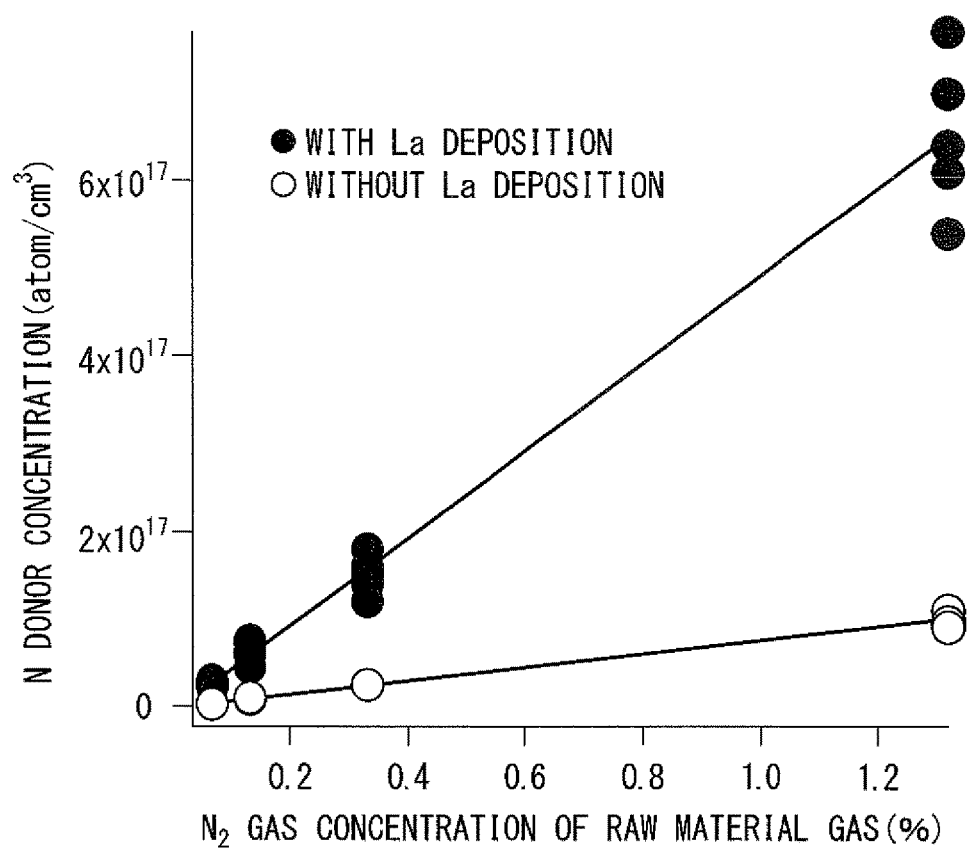
FIG. 4 A graph illustrating the results after the relationship between the $N_2$ gas concentration of the raw material gas and the N donor concentration is arranged by the presence or absence of La deposition.

FIG. 4 illustrates the measurement results of N donor concentration. The abscissa represents the concentration of $N_2$ gas added to the raw material gas, and the ordinate represents the N donor concentration. The black circle indicates the measurement results of Examples 2a to 2d, and the white circle indicates the measurement results of Comparative Examples 2a to 2d.

It could be confirmed from FIG. 4 that the N donor concentration can be increased by La. However, in FIG. 4, both the N donor concentration enhancement by La and the N donor concentration enhancement by an increase in the $N_2$ gas concentration of the raw material gas are included. Therefore, these were presented as in FIG. 1 by taking $N_d'/N_d$ ($N_d'$ is the N donor concentration of Examples 2a to 2d and $N_d$ is the N donor concentration of Comparative Examples 2a to 2d) into consideration.

It could be confirmed from FIG. 1 that the N donor concentration can be increased by La at a given ratio relative to the concentration of $N_2$ gas added to the raw material gas. That is, it was verified that the efficiency of N doping into SiC crystal can be increased by La.

Furthermore, in all of Examples 2a to 2d, the La concentration on the sample surface after the vapor-growth of SiC crystal was 0.5 atom %. It could be confirmed from this that La deposited on the SiC substrate is segregated to the SiC crystal surface. That is, it was verified that an SiC crystal can be vapor-grown between the SiC substrate and La.

Example 3

Preparation of Samples of Examples 3a and 3b

La was deposited throughout the surface of an SiC substrate. La was formed by a DC sputtering method (argon gas atmosphere, room temperature) such that when the surface is analyzed by X-ray photoelectron spectroscopy, the La concentration becomes 0.1 atom %. Here, 0.1 atom % corresponds to $9.6 \times 10^{12}$ atom/cm² in terms of the number of atoms per unit area.

The SiC substrate having deposited thereon La was set in a reaction chamber, and a raw material gas was supplied to the reaction chamber together with $H_2$ gas as a carrier gas to prepare an SiC crystal of Example 3a. As the raw material gas, a gas obtained by mixing $SiCH_3H_3$ gas, $CH_4$ gas and $N_2$ gas was supplied. The concentrations of $SiCH_3H_3$ gas, $CH_4$ gas and $N_2$ gas were 0.055%, 0.028% and 0.33%, respectively. Each gas concentration was in vol % relative to the total of $SiCH_3H_3$ gas, $CH_4$ gas, $N_2$ gas and $H_2$ gas.

An SiC crystal of Example 3b was prepared under the same conditions as in Example 3a except that at the time of deposition of La, La was deposited to achieve a concentration of 0.5 atom % when the surface is analyzed by X-ray photoelectron spectroscopy. Here, 0.5 atom % corresponds to $4.8 \times 10^{13}$ atom/cm² in terms of the number of atoms per unit area.

Preparation of Sample of Comparative Example 3a

An SiC crystal of Comparative Example 3a was prepared under the same conditions as in Examples 3a and 3b except that an SiC substrate on which La is not deposited was used so as to take $N_d'/N_d$ into consideration where $N_d$ is the N donor concentration when La was not deposited and $N_d'$ is the N donor concentration when La was deposited.

(Evaluation Method of Sample)

The SiC crystals of Examples 3a and 3b and Comparative Example 3a were measured for the N donor concentration by the C-V (capacity-voltage characteristic) method to determine $N_d'/N_d$.

(Evaluation Results)

Figure 5:
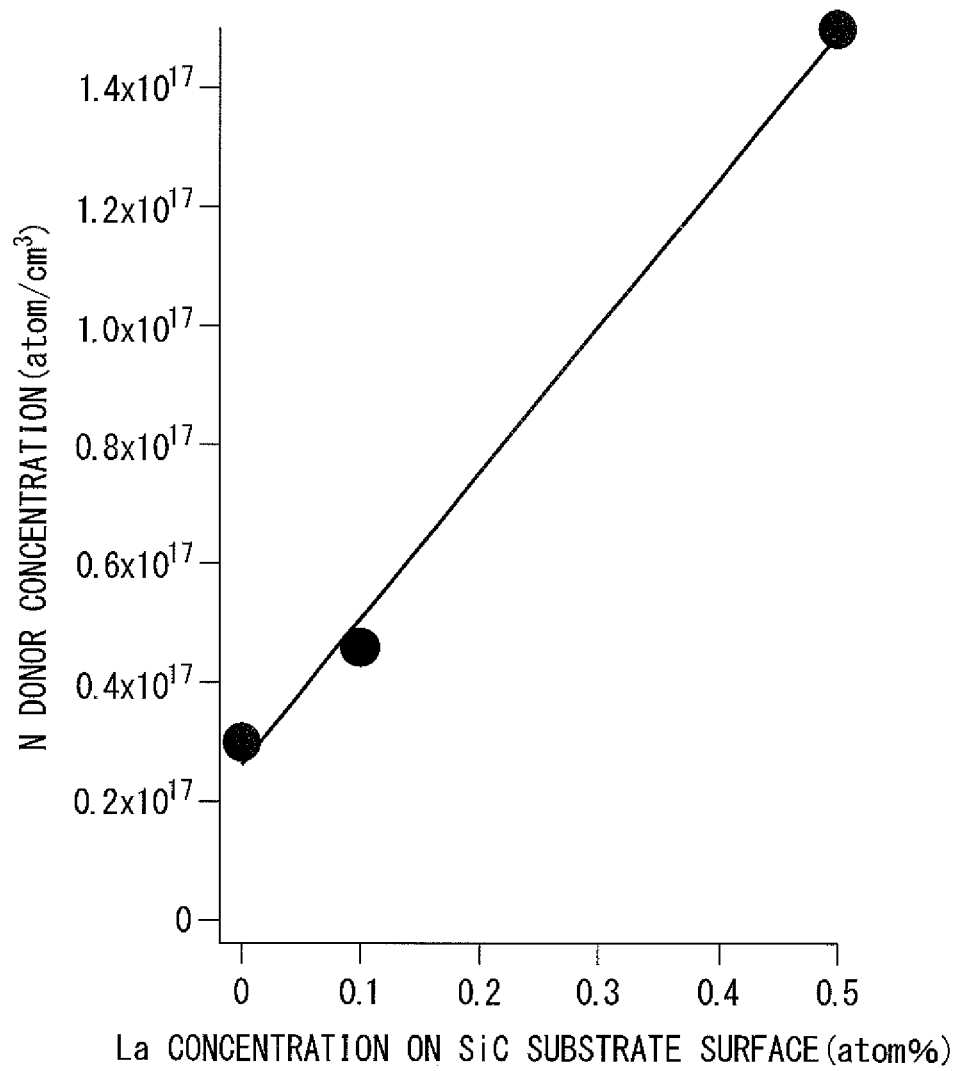
FIG. 5 A graph illustrating the relationship between the La concentration on the SiC substrate surface and the N donor concentration (under the supply of a given amount of $N_2$ gas).
Figure 6:
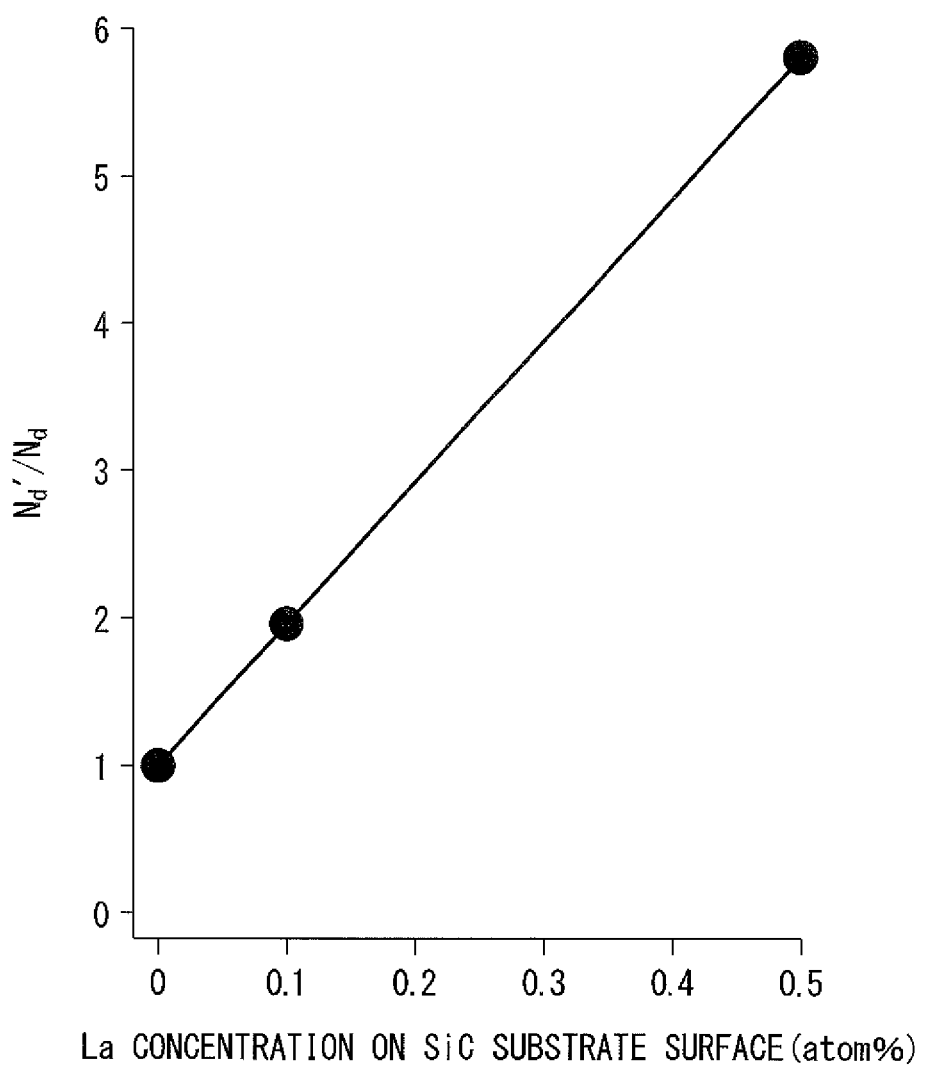
FIG. 6 A graph illustrating the relationship between the La concentration on the SiC substrate surface and $N_d'/N_d$ (the rate of improvement in the N donor concentration due to La deposition).

FIGS. 5 and 6 illustrate the measurement results of N donor concentration. With respect to FIG. 5, the abscissa represents the La concentration on the SiC substrate surface, and the ordinate represents the N donor concentration. With respect to FIG. 6, the abscissa represents the La concentration on the SiC substrate surface, and the ordinate represents $N_d'/N_d$. It could be confirmed from FIGS. 5 and 6 that when the La concentration is increased, the N donor concentration can be elevated.

When an SiC crystal is vapor-grown on an SiC substrate on which La is not deposited, the N donor concentration Nd(0) is proportional to the supply of N. This is represented by the following formula:

$$Nd(0) = A[N]$$

wherein A is a proportionality constant and [N] is the $N_2$ gas concentration in the gas supplied to the reaction chamber.

On the other hand, when an SiC crystal is vapor-grown on an SiC substrate on which La is deposited, the N donor concentration Nd([La]) linearly increases relative to [La] and [N]. Here, [La] is the La concentration (atom %) on the SiC substrate surface. This is represented by the following formula:

$$Nd([La])=(B[La]+1)Nd(0)$$

wherein B is a constant.

When [La]=0.1 and [La]=0.5 are substituted into the formula above, $$Nd(0.1)=(B\times 0.1+1)Nd(0) \quad (a1)$$

$$Nd(0.5)=(B\times 0.5+1)Nd(0) \quad (b1)$$

are established.

Here, from FIG. 5, $$Nd(0.1)\times 3.3=Nd(0.5) \quad (c1)$$

When (c1) is substituted into (a1) and (b1), $$3.3\times(B\times 0.1+1)Nd(0)=(B\times 0.5+1)Nd(0)$$

is established, and when the formula is solved for B, $$3.3\times(B\times 0.1+1)=(B\times 0.5+1)$$

is established, as a result, $$B=13.5.$$

That is, the following formula is obtained:

$$Nd([La])=(13.5\times[La]+1)Nd(0)$$

Then, it is recognized that when 1 atom % of La is deposited on the SiC substrate surface, the N donor concentration can be 14.5 times larger compared with no depositing La.

Example 4

Preparation of Samples of Examples 4a to 4c

Ce ion was implanted a plurality of times throughout the surface of an SiC substrate at an accelerating voltage of 15 to 170 keV to achieve an ion-implantation amount of $6.1\times 10^{13}$ atom/cm$^2$. When ion implantation is performed in this way, an ion implantation region with a relatively uniform concentration distribution, i.e., a box profile, can be obtained near the surface of the SiC substrate. By this plurality of times of ion implantation, the Ce concentration in the range of 10 to 70 nm from the SiC substrate surface was $1\times 10^{19}$ atom/cm$^3$.

The SiC substrate having implanted thereinto Ce ion was treated (annealing) for 30 minutes in a hydrogen atmosphere at 1.33 kPa (10 Torr) and 1,650° C., whereby the Ce layer was segregated to the SiC substrate surface. After the uneven distribution, the surface of the portion to which Ce was segregated was analyzed by X-ray photoelectric spectroscopy, as a result, the Ce concentration was 0.6 atom %. In the analysis, X-ray photoelectron spectrometer Model 1600 manufactured by ULVAC-PHI, Inc. was used. In addition, the measurement was performed by arranging the normal direction of the sample surface and the normal direction of the detector to make 45°.

Subsequently, the SiC substrate having implanted thereinto Ce ion was set in a reaction chamber, and a raw material gas was supplied to the reaction chamber together with $H_2$ gas as a carrier gas. As the raw material gas, a gas obtained by mixing $SiCH_3H_3$ gas, $CH_4$ gas and $N_2$ gas was supplied. The concentration of $SiCH_3H_3$ gas was 0.055% in all of Examples 4a to 4c. The concentration of $CH_4$ gas was 0.028% in all of Examples 4a to 4c. The concentration of $N_2$ gas was 0.11% in Example 4a, 0.28% in Example 4b, or 1.1% in Example 4c. Each gas concentration was in vol % relative to the total of $SiCH_3H_3$ gas, $CH_4$ gas, $N_2$ gas and $H_2$ gas.

Preparation of Samples of Comparative Examples 4a to 4c

An SiC crystal of Comparative Example 4a was prepared under the same conditions as in Example 4a except for using an SiC substrate on which Ce ion is not implanted. Similarly, SiC crystals of Comparative Examples 4b and 4c corresponding to Examples 4b and 4c, respectively, were prepared.

(Evaluation Method of Sample)

The SiC crystals of Examples 4a to 4c and Comparative Examples 4a to 4c were measured for the N donor concentration by the C-V (capacity-voltage characteristic) method.

In addition, the SiC crystals of Examples 4a to 4c was measured for the Ce concentration on the sample surface after the vapor-growth of SiC crystal. The measurement method was the same as the method used when measuring the concentration after uneven distribution of Ce to the surface.

(Evaluation Results)

Figure 7:
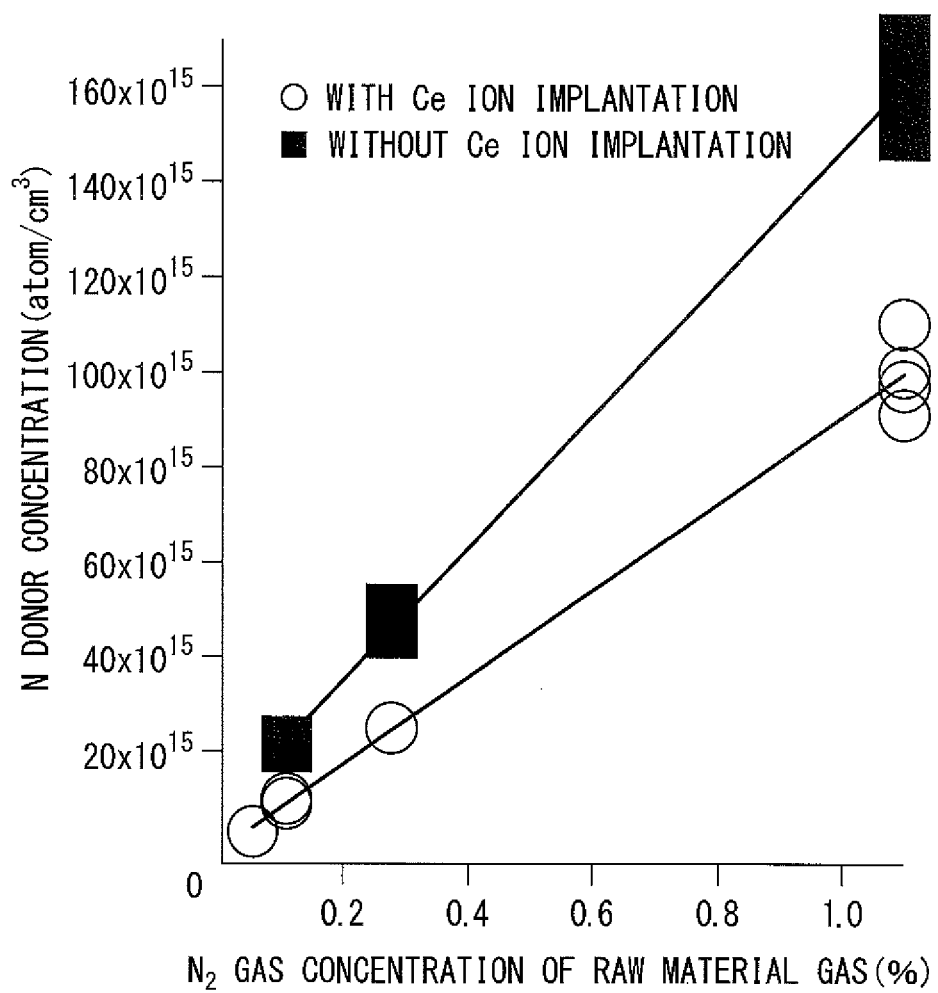
FIG. 7 A graph illustrating the results after the relationship between the $N_2$ gas concentration of the raw material gas and the N donor concentration is arranged by the presence or absence of Ce ion implantation.

FIG. 7 illustrates the measurement results of N donor concentration. The abscissa represents the concentration of $N_2$ gas added to the raw material gas, and the ordinate represents the N donor concentration. The black square indicates the measurement results of Examples 4a to 4c, and the white circle indicates the measurement results of Comparative Examples 4a to 4c.

It could be confirmed from FIG. 7 that the N donor concentration can be increased by Ce. However, in FIG. 7, both the N donor concentration enhancement by Ce and the N donor concentration enhancement by an increase in the $N_2$ gas concentration of the raw material gas are included. Therefore, these were presented in FIG. 8 by taking, as with FIG. 1, $N_d'/N_d$ into consideration ($N_d$ is the N donor concentration of Comparative Examples 4a to 4c and $N_d'$ is the N donor concentration of Examples 4a to 4c).

Figure 8:
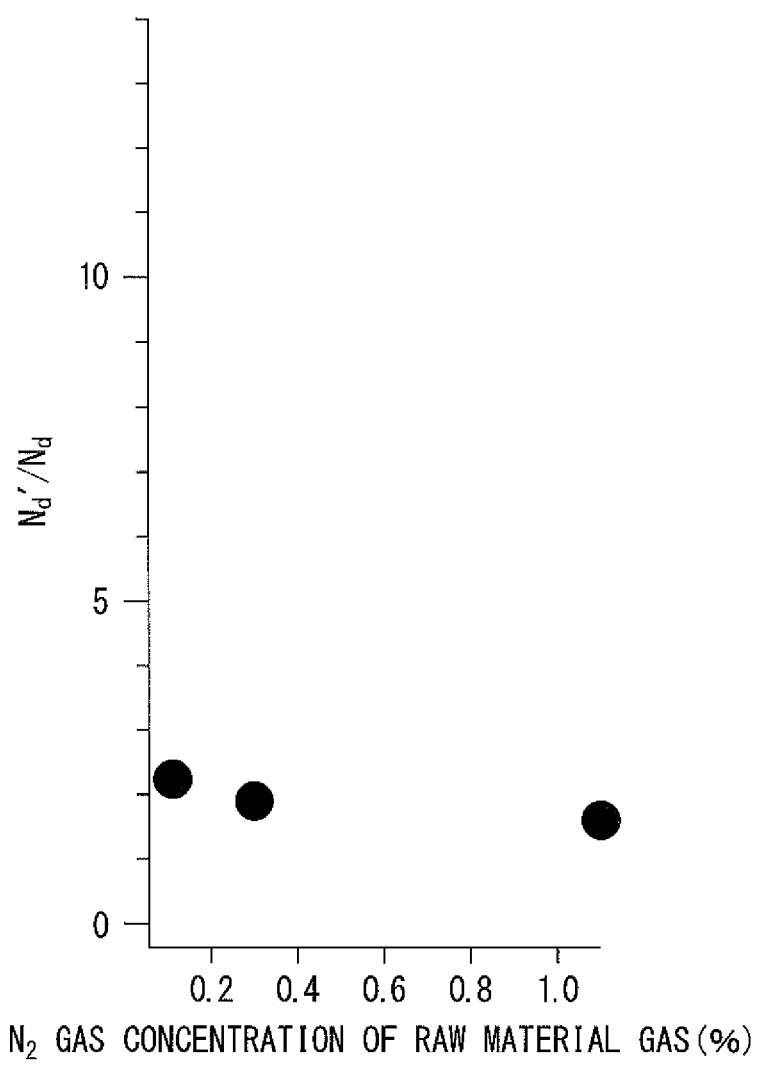
FIG. 8 A graph illustrating the relationship between the $N_2$ gas concentration of the raw material gas and $N_d'/N_d$ (the rate of improvement in the N donor concentration due to Ce ion implantation).

It could be confirmed from FIG. 8 that the N donor concentration can be increased by Ce at a given ratio relative to the $N_2$ gas concentration of the raw material gas. That is, it was verified that the efficiency of N doping into SiC crystal can be increased by Ce.

Furthermore, in all of Examples 4a to 4c, the Ce concentration on the sample surface after the vapor-growth of SiC crystal was 0.2 atom %. It could be confirmed from this that the SiC substrate having implanted thereinto Ce ion is segregated to the SiC crystal surface. That is, it was verified that an SiC crystal can be vapor-grown between the SiC substrate and Ce. In this connection, Ce segregated near the SiC substrate surface is somewhat evaporated due to heating at the time of vapor-growing an SiC crystal, and Ce desorb from the SiC crystal before and after the vapor-growth of SiC crystal. For this reason, the Ce concentration was reduced to 0.2 atom % from 0.5 atom %.

Example 5

Preparation of Samples of Examples 5a to 5c

Ce was deposited throughout the surface of an SiC substrate. Ce was formed such that when the surface is analyzed by X-ray photoelectron spectroscopy, the Ce concentration becomes 0.2 atom %. Here, 0.2 atom % corresponds to $1.9 \times 10^{13}$ atom/cm$^2$ in terms of the number of atoms per unit area.

The SiC substrate having deposited thereon Ce was set in a reaction chamber, and a raw material gas was supplied to the reaction chamber together with H$_2$ gas as a carrier gas to prepare an SiC crystal of Example 5a. As the raw material gas, a gas obtained by mixing SiCH$_3$H$_3$ gas, CH$_4$ gas and N$_2$ gas was supplied. The concentrations of SiCH$_3$H$_3$ gas and CH$_4$ gas were 0.055% and 0.028%, respectively. Each gas concentration was in vol % relative to the total of SiCH$_3$H$_3$ gas, CH$_4$ gas, N$_2$ gas and H$_2$ gas.

An SiC crystal of Example 5b was prepared under the same conditions as in Example 5a except that at the time of deposition, Ce was deposited to achieve a concentration of 0.7 atom % when the surface is analyzed by X-ray photoelectron spectroscopy. Here, 0.7 atom % corresponds to $6.7 \times 10^{13}$ atom/cm$^2$ in terms of the number of atoms per unit area.

Furthermore, an SiC crystal of Example 5c was prepared under the same conditions as in Example 5a except that at the time of deposition, Ce was deposited to achieve a concentration of 1.0 atom % when the surface is analyzed by X-ray photoelectron spectroscopy. Here, 1.0 atom % corresponds to $9.6 \times 10^{13}$ atom/cm$^2$ in terms of the number of atoms per unit area.

Preparation of Sample of Comparative Example 5a

An SiC crystal of Comparative Example 5a was prepared under the same conditions as in Examples 5a to 5c except that an SiC substrate on which Ce is not deposited was used so as to take $N_d'/N_d$ into consideration where $N_d$ is the N donor concentration when Ce was not deposited and $N_d'$ is the N donor concentration when Ce was deposited.
(Evaluation Method of Sample)

The SiC crystals of Examples 5a to 5c and Comparative Example 5a were measured for the N donor concentration by the C-V (capacity-voltage characteristic) method to determine $N_d'/N_d$.
(Evaluation Results)

Figure 9:
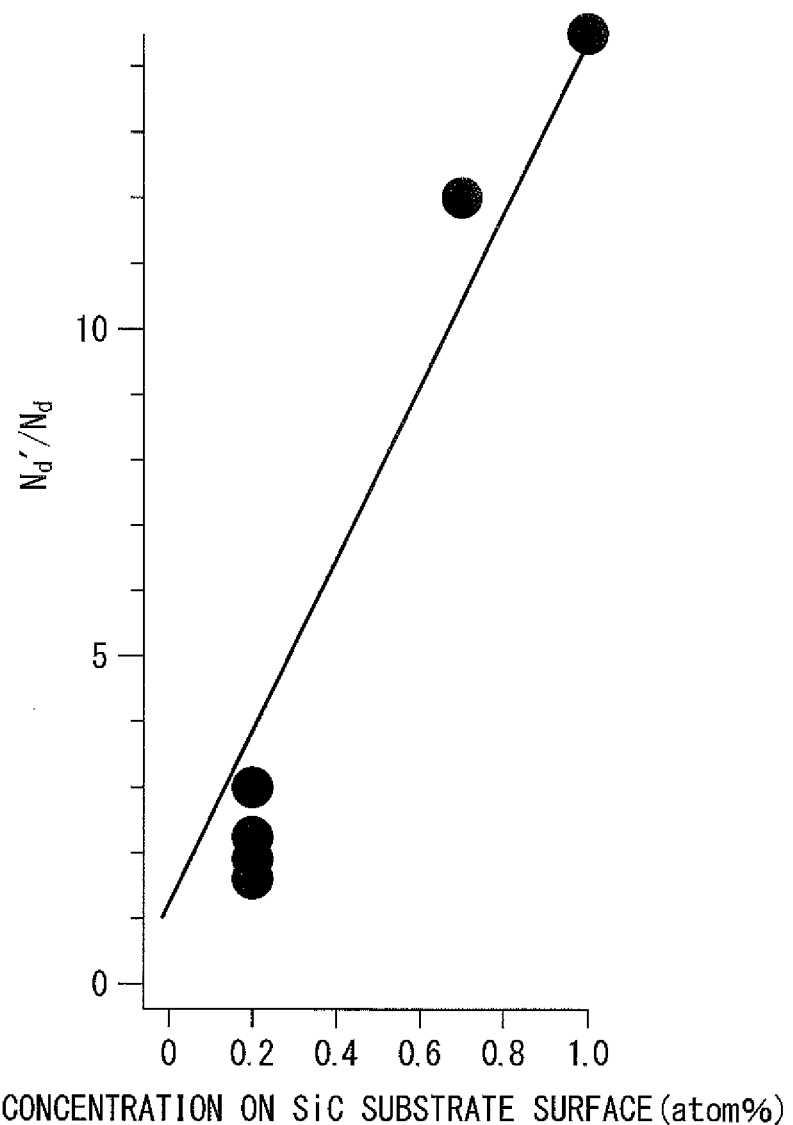
FIG. 9 A graph illustrating the relationship between the Ce concentration on the SiC substrate surface and $N_d'/N_d$ (the rate of improvement in the N donor concentration due to Ce deposition).

FIG. 9 illustrates the measurement results of N donor concentration. The abscissa represents the Ce concentration on the SiC substrate surface, and the ordinate represents $N_d'/N_d$. It could be confirmed from FIG. 9 that when the Ce concentration is increased, the N donor concentration can be elevated.

Example 6

Preparation of Sample of Example 6a

Ce ion was implanted throughout the surface of a 4H—SiC substrate. The ion implantation conditions are shown in Table 1. The conditions of Table 1 are determined so that when all of these conditions are performed, many Ce atoms can be implanted into a depth of about 50 nm from the surface.

TABLE 1

| Accelerating Voltage (keV) | Dose (atom/cm$^2$) |
|---|---|
| 170 | $3.20 \times 10^{13}$ |
| 90 | $1.22 \times 10^{13}$ |

TABLE 1-continued

| Accelerating Voltage (keV) | Dose (atom/cm$^2$) |
|---|---|
| 50 | $0.92 \times 10^{13}$ |
| 25 | $0.50 \times 10^{13}$ |
| 15 | $0.30 \times 10^{13}$ |

Figure 10:
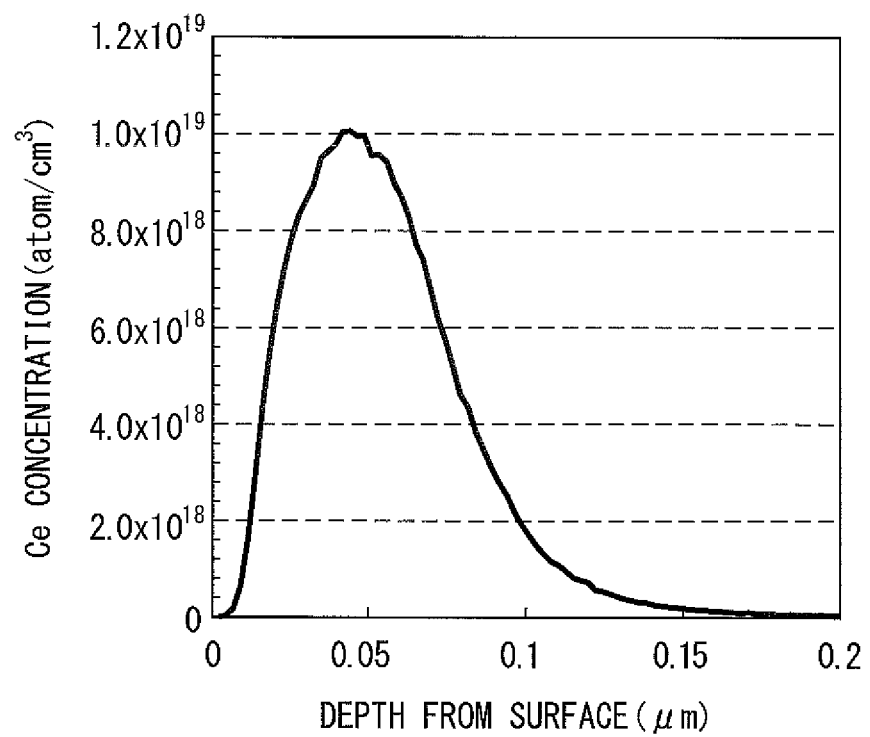
FIG. 10 A view illustrating the Ce concentration distribution in the depth direction when Ce ion is implanted into the SiC substrate.

FIG. 10 is a view illustrating the Ce concentration distribution in the depth direction after ion implantation. The abscissa represents the depth from the surface, and the ordinate represents the Ce concentration. The Ce concentration was measured by secondary ion mass spectrometry.

As apparent from FIG. 10, it could be confirmed that the Ce concentration has a peak at a position of about 50 nm (0.05 μm) from the surface of the 4H—SiC substrate. This SiC substrate having implanted thereinto Ce ion was used without an annealing treatment.

The 4H—SiC substrate illustrated in FIG. 10 was set in a reaction chamber, and monomethylsilane gas at 8 ccm, C$_3$H$_8$ gas of 2 in terms of C/Si ratio, and N$_2$ gas were supplied to the reaction chamber together with H$_2$ gas as a carrier gas. The growth temperature was 1,500° C., and the pressure in the reaction chamber was 11 kPa. In addition, depending on the sample, the amount of N$_2$ gas was changed by the N/Si ratio.

Preparation of Sample of Comparative Example 6a

An SiC crystal of Comparative Example 6a was prepared under the same conditions as in Example 6a except for using an SiC substrate into which Ce ion is not implanted.
(Evaluation Method of Sample)

A Schottky diode was fabricated by forming a 100 nm-thick Ni electrode by an electron beam deposition method on each of the SiC crystals of Example 6a and Comparative Example 6a and measured for the N donor concentration by the C-V (capacity-voltage characteristic) method.
(Evaluation Results)

Figure 11:
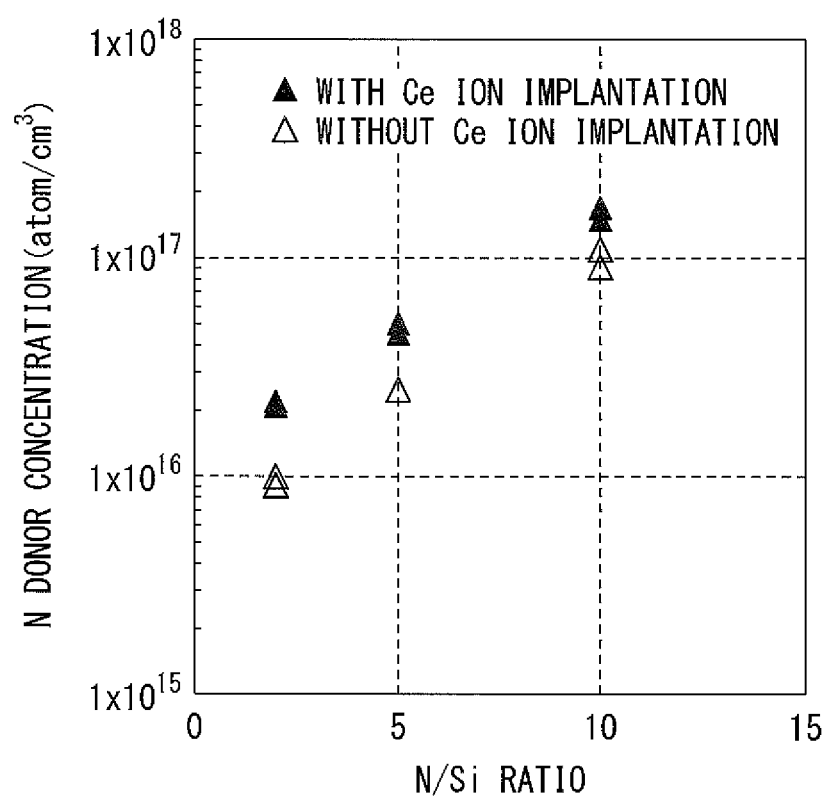
FIG. 11 A graph illustrating the results after the relationship between the N/Si ratio of the raw material gas and the N donor concentration is arranged by the presence or absence of Ce ion implantation.

FIG. 11 illustrates the measurement results of N donor concentration. The abscissa represents the N/Si ratio (nitrogen/silicon ratio), and the ordinate represents the N donor concentration. It was confirmed from FIG. 11 that even when Ce distributed region is formed by ion-implantation and an SiC crystal is thereafter vapor-grown without annealing treatment, the N donor concentration can be enhanced.

Figure 12:
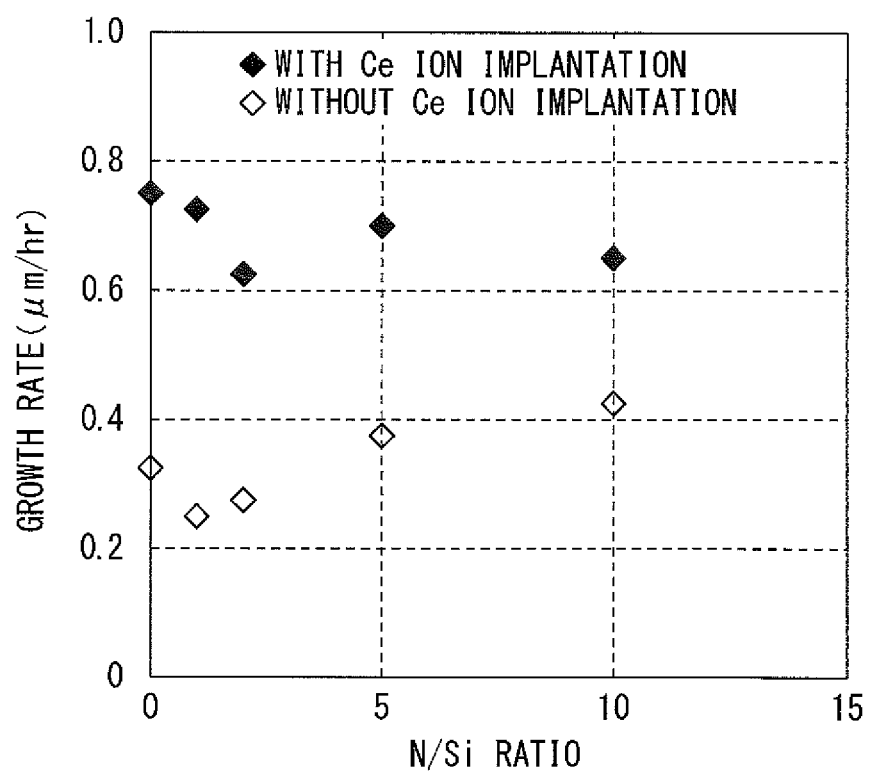
FIG. 12 A graph illustrating the relationship between the N/Si ratio of the raw material gas and the growth rate of an N-doped SiC crystal, arranged by the presence or absence of Ce ion implantation.

In addition, the growth rate at the time of vapor-growth of SiC crystal was measured. FIG. 12 illustrates the results. The abscissa represents the N/Si ratio (nitrogen/silicon ratio), and the ordinate represents the growth rate. It was confirmed from FIG. 12 that the rate of vapor-growth of SiC crystal can be enhanced by Ce ion implantation.

Example 7

Preparation of Sample of Example 7a

Ti was deposited throughout the surface of an SiC substrate by a vapor deposition method. The Ti deposition amount was $2 \times 10^{11}$ atom/cm$^2$ in terms of the number of atoms per unit area. The SiC substrate having deposited thereon Ti was treated for 30 minutes in a hydrogen atmosphere at 1.33 kPa (10 Torr) and 1,650° C., whereby the surface of Ti was cleaned.

Subsequently, the SiC substrate having deposited thereon Ti was set in a reaction chamber, and a raw material gas was supplied to the reaction chamber together with H$_2$ gas as a carrier gas to prepare an SiC crystal of Example 7a. As the raw material gas, a gas obtained by mixing SiH$_4$ gas and C$_3$H$_8$ gas was supplied. In addition, SiH$_4$ gas, in a ratio of 40% relative to H$_2$ gas, at 20 ccm, N$_2$ gas at 100 ccm, and H$_2$ gas at 30 slm under 11 kPa were supplied. The C$_3$H$_8$ gas was 0.75 in terms of C/Si ratio.

Preparation of Sample of Comparative Example 7a

An SiC crystal of Comparative Example 7a was prepared under the same conditions as in Example 7a except for using an SiC substrate on which Ti is not deposited.
(Evaluation Method of Sample)
The SiC crystals of Example 7a and Comparative Example 7a were measured for the N donor concentration by the C-V (capacity-voltage characteristic) method.
(Evaluation Results)
The N donor concentration of Example 7a was $2\times10^{17}$ atom/cm$^3$. On the other hand, the N donor concentration of Comparative Example 7a was $1\times10^{17}$ atom/cm$^3$.

It was confirmed from these results that the N donor concentration can be elevated by the Ti layer.

The effects of the present invention could be verified by the results above.

INDUSTRIAL APPLICABILITY

According to the present invention, N is easily doped into an SiC crystal, so that the N donor concentration in the SiC crystal can be made higher than ever before. To this effect, the industrial applicability of the present invention is great.

DESCRIPTION OF NUMERICAL REFERENCES

10 SiC Substrate
20 La Deposition region
30 N-Doped SiC crystal
30a High nitrogen concentration part
30b Low nitrogen concentration part
40 Insulating film
50a Source electrode
50b Drain electrode
50c Gate electrode
60 Horizontal MESFET transistor

The invention claimed is:

1. A method for producing an SiC crystal, comprising supplying a raw material gas containing Si, C and N to vapor-grow an N-doped SiC crystal on an SiC substrate,
   wherein the SiC substrate is an SiC substrate having deposited on the surface thereof La, Ce or Ti or an SiC substrate having implanted thereinto La, Ce or Ti ion.

2. The method according to claim 1, wherein only in part of the surface of the SiC substrate, La, Ce or Ti is deposited or La, Ce or Ti ion is implanted.

3. The method according to claim 1, wherein the La, Ce or Ti is deposited by a vapor deposition method, a sputtering method, or a CVD method.

4. The method according to any one of claim 1, further comprising removing the deposited La, Ce or Ti after the vapor-phase growth.

5. The method according to claim 1, further comprising applying an annealing treatment to the SiC substrate having implanted thereinto La, Ce or Ti ion, after the ion implantation and before the supply of the raw material gas.

6. The method according to any one of claim 1, further comprising depositing La, Ce or Ti on or ion-implanting La, Ce or Ti into the
   surface of the SiC crystal in the middle of the vapor-phase growth.

* * * * *